United States Patent
Zhu et al.

(10) Patent No.: US 6,324,037 B1
(45) Date of Patent: Nov. 27, 2001

(54) MAGNETICALLY STABLE SPIN-VALVE SENSOR

(75) Inventors: Li-Yan Zhu; Yimin Guo; Mao-Min Chen, all of San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/359,895

(22) Filed: Jul. 26, 1999

(51) Int. Cl.$^7$ .................................................... G11B 5/127
(52) U.S. Cl. ................................................... 360/324.12
(58) Field of Search ........................... 360/324.12, 324.1, 360/324.11, 324, 327.32

(56) References Cited

U.S. PATENT DOCUMENTS

| | | | |
|---|---|---|---|
| 5,206,590 | 4/1993 | Dieny et al. | 324/252 |
| 5,301,794 | 4/1994 | Cain et al. | 60/113 |
| 5,408,377 | 4/1995 | Gurney et al. | 360/113 |
| 5,666,248 | 9/1997 | Gill | 360/113 |
| 5,668,687 * | 9/1997 | Chen et al. | 360/327.32 |
| 5,739,988 * | 4/1998 | Gill | 360/324.12 |
| 5,828,531 | 10/1998 | Gill | 360/113 |
| 5,883,763 * | 3/1999 | Yuan et al. | 360/324 |
| 6,185,078 * | 2/2001 | Lin et al. | 360/324.12 |

* cited by examiner

*Primary Examiner*—Allen Cao
(74) *Attorney, Agent, or Firm*—George O. Saile; Stephen B. Ackerman; Graham S. Jones, II

(57) ABSTRACT

A laminated spin-valve sensor comprises a fixed magnetic layer and a free-layer separated by a thin spacer layer, with electrical leads interconnected to ends of the sensor. The sensor is longitudinally biased by permanently magnetized structures between the electrical leads and the sensor ends. Each electrical lead interconnects to a sensor end through a permanently magnetized structures which are permanent magnets or exchange-coupled thin films. Exchange-coupled films are canted in a direction consistent with a desired direction of fixed-layer magnetization. Each layer of the sensor has an easy axis aligned with a respective desired direction of magnetization. The transverse bias of the fixed-layer is provided by the bias current and enhanced by a transverse high uniaxial anisotropy, with a selected material with proper magnetostriction. The permanently magnetized structure incorporates a seed-layer and a capping layer for improving the magnetic property.

52 Claims, 4 Drawing Sheets

MAGNETICALLY STABLE SPIN-VALVE SENSOR

BACKGROUND OF THE INVENTION

1. Field of the Invention

This invention relates to transducers for reading data from a magnetic recording medium and more particularly to transducers employing spin valve sensors.

2. Description of Related Art

A spin-valve is a type of magnetoresistive sensor for retrieving previously recorded magnetic signals from a magnetic recording medium, such as a disk or a tape surface. It is considerably more sensitive than the Amorphous MagnetoResistive (AMR) sensor. The sensing area of the spin-valve comprises of at least one very thin electrically conductive, non-magnetic spacer-layer sandwiched between two thin, electrically conductive magnetic layers. In each magnetic layer, the resultant magnetic field is characterized by its direction. The electrical resistance of the sensing area is affected by the angle between the magnetic fields in the two magnetic layers.

In a conventional spin-valve, the magnetic field in one of the magnetic layers is held (pinned) in a fixed direction. This magnetic layer is often called the "pinned-layer". Pinning can be achieved by exchange-coupling with a anti-ferromagnetic film. Alternatively, it can also be achieved by means of a permanent magnet. The magnetic film in another magnetic layer is allowed to rotate, subject to the "readback" magnetic field, which is the field from a previously recorded magnetic pattern. This magnetic layer is often called the "free-layer". Rotation of the magnetic field in the free-layer alters the angle between two fields separated by the spacer-layer, hence causing a resistance change in the sensing area.

It is desirable that the resistance change be proportional to the readback magnetic field. This feature is called the linearity of the sensor. To maximize the linearity, the magnetization in the free-layer and the pinned-layer are often set orthogonally to each other. It is also desirable that the sensor be robust against external fields, including the readback field. For this purpose a longitudinal bias field is often applied on the free-layer, usually through electrical leads of the sensor. This bias field can be supplied either by a pair of permanent magnets, or a pair of magnetic layers coupled to anti-ferromagnetic layers.

It is difficult to achieve the perpendicularity in the magnetization between the pinned and the free layers. Materials with distinct blocking temperature are often needed to provide desired magnetic field in distinct directions. In order to satisfy this constrain, one or more material with undesirable characteristics, such as chemical instability, must be selected. The resulting spin-valve sensor becomes very easily corroded. This makes the sensor difficult to process, and unreliable to use.

It is also difficult to maintain the perpendicularity between the magnetic fields, especially when the sensor is subject to an undue large current. This current is often induced by electrostatic discharge (ESD). The current heats up the sensor beyond the blocking temperature of exchange interface. It also generates an inductive magnetic field. As a result the magnetization of the pinned-layer may be altered inadvertently. This makes the spin-valve sensor difficult to handle and process. In some cases the flash temperature in an operating disk drive (caused by the slider-disk interference) is sufficiently high that the pinned-layer may be magnetically disturbed by the readback field. To prevent the disturbance, a conventional spin-valve is often forced to operate substantially farther away from the recorded medium than an inductive or AMR (Amorphous MagnetoResistive) sensor.

Thus a conventional spin-valve sensor is both difficult to process and unreliable to operate. To overcome this problem, U.S. Pat. No. 5,301,079 of Cain et al. for "Current Biased Magnetoresistive Spin Valve Sensor" describes a spin-valve in which both magnetic layers are free-layers. The magnetic layers are biased by the sensing current which flows orthogonally to the storage medium. The bias fields in two free-layers are both perpendicular to the readback field, but opposite to each other. Thus the readback field affects the angle between the resultant fields in the free-layers. This design works in principle. However it is difficult to fabricate.

U.S. Pat. No. 5,666,248 of Gill for "Magnetization of Pinned and Free Layers of Spin Valve Sensor Set by Current Fields" describes a spin-valve in which the sensing current flows in parallel with the medium, much the same as in conventional AMR (Amorphous MagnetoResistive) heads. Two magnetic layers are biased by the sensing current, similar to the bias scheme of a conventional AMR (Amorphous MagnetoResistive) head. However, Gill U.S. Pat. No. 5,666,248 states that an AMR (Amorphous MagnetoResistive) bias scheme will not work for a spin-valve, because the demagnetization field induced on the free-layer by the pinned layer is greater than the bias field from the sensing current. To minimize the demagnetization field, two flux guides are placed along upper and lower edges of the sensing area. However the flux guides are difficult to fabricate within an extremely small spin-valve (about 1 $\mu$m×1 $\mu$m in the sensing area).

U.S. Pat. No. 5,828,531 of Gill for "Spin Valve Sensor with Enhanced Magnetoresistance" describes a pinned magnetoresistive layer of soft ferromagnetic cobalt formed over an antiferromagnetic layer of FeMn, NiO or NiMn formed over and $Al_2O_3$ gap.

SUMMARY OF THE INVENTION

The present invention provides a spin-valve which in many respects resembles a conventional AMR (Amorphous MagnetoResistive) head. In particular, this invention provides a spin-valve resembling a SAL (Soft-Adjacent Layer) type of AMR (Amorphous MagnetoResistive) head. In a conventional spin-valve MR head, a magnetic field in one of the magnetic layers is held (pinned) in a fixed direction, but in the present invention, the GMR (Giant MagnetoResistive) effect is achieved without a pinned-layer, thus eliminating disadvantages associated with pinning. Specifically, the need for materials of distinct blocking temperature, the instability of the pinned direction due to electrical overstress and flash temperature, are eliminated.

In a SAL (Soft-Adjacent Layer) head, a thin soft-magnetic layer is placed adjacent to a MagnetoResistive (MR) sensing layer. The soft-layer and the MR-layer are separated by a very thin electrically conductive, non-magnetic layer, usually a tantalum layer approximately 50 Å in thickness. When a sensing current is passed through the SAL (Soft-Adjacent Layer) head, it causes the soft-layer and MR-layer to magnetize transversely to the current direction. By the right-hand rule, which is known in elementary physics, the soft-layer and the MR-layer are magnetized in the opposite directions.

For magnetic stability and linearity, a longitudinal magnetic field is applied to bias both the soft-layer and the MR layer. The bias field can be supplied either by a pair of permanent magnets, or by a pair of ferromagnetic layers coupled with anti-ferromagnetic layers. The bias field is typically applied through the electrical leads. Currently, the biasing of the free-layer is a mature art.

Because the soft-layer is very close to the MR-layer, it may compete with the MR-layer for the readback flux. A worse problem caused by the opposite transverse bias field is that the magnetoresistive effects of the two layers are in opposite directions, thereby tending to cancel each other. To avoid these problems, the soft-layer is often made so that it is saturated more easily than the MR-layer. When the sensing current is sufficiently large, the soft-layer saturates. It remains transversely magnetized, irrespective to the readback flux. Meanwhile, the MR-layer remains unsaturated. It is magnetized at an angle from the longitudinal axis, typically about 45°, where its response to readback flux has a maximum degree of linearity. The bias angle of the MR-layer is determined by the magnetic moment ratio between the two layers.

In a spin-valve, the pinned-layer is usually magnetized transversely. This is the same as the soft-layer in an (Amorphous MagnetoResistive) AMR head. Thus it makes sense to replace the pinned-layer by a saturated-magnetic layer. The main difference is that while a pinned-layer is saturated at all times, a soft-layer is saturated only in the presence of a sufficiently large sensing current. The present invention is actually advantageous in this regard. Because the soft-layer has no memory, its magnetization is solely dependent on the bias current. There is no permanent change due to electrical overstress and flash temperature.

However in a spin-valve, the ideal bias angle of the free-layer is longitudinal (0°). This differs significantly from the ideal bias angle of the MR-layer in a SAL (Soft-Adjacent Layer) head, which is about 45°. Thus it is quite unobvious that a SAL-like (Soft-Adjacent Layer-like) structure, specifically two magnetic layers biased transversely by the sensing current alone, without a pinning field, is suitable for a spin-valve head. We have developed a mathematical model which reveals that the sensitivity and linearity of a spin-valve (both single and dual) are quite insensitive to the bias angle of the free-layer.

We also realize that in pursuit of high recording density, the magnetic medium thickness decreases as a function of advances in the magnetic recording art. The readback field is now very small compared with the saturating field of the magnetic sensor. Furthermore, the linearity of a single-stripe AMR (Amorphous MagnetoResistive) sensor is not very good. The industry has learned how to cope with nonlinearity. Therefore perfection in linearity is no longer necessary for a magnetic sensor.

In addition, while a typical SAL (Soft-Adjacent Layer) head is biased at 45° or more in the MR-layer, the bias angle can be adjusted by the moment ratio between the MR-layer and the soft-layer. Therefore, we conclude that it is possible to make a SAL (Soft-Adjacent Layer)-like spin-valve, eliminating the pinning field.

An object of the present invention is to provide a spin-valve sensor which requires no permanent transverse bias (pinning). The absence of a permanent transverse bias eliminates the difficulty of finding suitable material.

Another object of the present invention is to provide a spin-valve sensor which is tolerant to electrical and thermal disturbance. Such a resilient sensor would enjoy higher yield in the assembly into a functional magnetic recording file. Such a resilient sensor would also permit the sensor to operate at a closer spacing from the medium, hence improving the resolution of the sensor.

Yet another object of the present invention is to provide a spin-valve sensor which is easy to fabricate and process.

In accordance with this invention a spin-valve sensor comprises a laminated sensor which comprising a fixed magnetic layer and a free-layer separated by a thin spacer layer, with electrical leads interconnected to ends of the sensor. The sensor is longitudinally biased by permanently magnetized structures located between the electrical leads and the ends of the sensor. Each of the electrical leads is interconnected to one of the ends of the sensor through one of the permanently magnetized structures. Preferably, the permanently magnetized structures are permanent magnets or exchange-coupled thin films. Preferably the exchange-coupled films are canted in a direction consistent with a desired direction of fixed-layer magnetization. Preferably each layer of the sensor has an easy axis and the easy axis of each layer of the sensor is aligned with a respective desired direction of magnetization. Preferably, the transverse bias of the fixed-layer is enhanced by a transverse high uniaxial anisotropy, with a selected material with proper magnetostriction. Preferably, the permanently magnetized structure incorporates a seed-layer and a capping layer for improving the magnetic property.

In accordance with another aspect of this invention a method is provided for forming a spin-valve sensor in accordance with this invention. Form a laminated sensor which comprising a fixed magnetic layer and a free-layer separated by a thin spacer layer. Form electrical leads connected to ends of the sensor, and form permanently magnetized structures located between the electrical leads and the ends of the sensor for biasing the sensor longitudinally. Preferably, the permanently magnetized structures can be permanent magnets or exchange-coupled thin films. Preferably the exchange-coupled films are canted in a direction consistent with a desired direction of fixed-layer magnetization. Preferably each layer of the sensor has an easy axis and the easy axis of each layer of the sensor is aligned with a respective desired direction of magnetization. Preferably, the transverse bias of the fixed-layer is enhanced by a transverse high uniaxial anisotropy, with a selected material with proper magnetostriction. Preferably, the permanently magnetized structure incorporates a seed-layer and a capping layer for improving the magnetic property.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
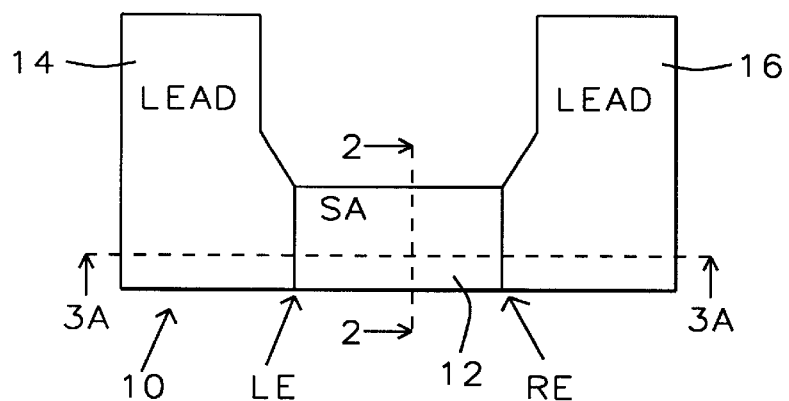
FIG. 1 shows a planar view of a spin-valve sensor with a sensing area, but without top and bottom shields which have been omitted for convenience of illustration.

A structure in accordance with this invention is described with reference to a prior-art SAL (Soft-Adjacent Layer) head. The sensing area remains to be a tri-layer film in which two magnetic layers are separated by a non-magnetic layer. In a SAL (Soft-Adjacent Layer) head, the three layers are a soft layer, a spacer layer, and an MR layer. In the spin-valve in accordance with this invention, the corresponding layers are the fixed layer, a spacer layer, and a free layer, respectively.

The spacer layers in a SAL (Soft-Adjacent Layer) head and the spacer layers a spin-valve differ, significantly. The spacer layer in a SAL (Soft-Adjacent Layer) head is preferably a poor conductor. The spacer layer in a spin-valve is preferably a good conductor whose thickness is less than the mean-free-path of the electron scattering. The magnetic layers in a spin-valve are generally thinner than the magnetic layers in a SAL (Soft-Adjacent Layer) head.

In addition, the magnetic moment ratio (MMR) in a spin-valve head is defined as follows:

MMR=Magnetic Moment of fixed-layer/Magnetic Moment of free-layer

The MMR value in a spin-valve head is typically lower than the MMR value in a SAL head which is defined as follows:

MMR=Magnetic Moment of Soft-layer/Magnetic Moment of MR-layer

The leads are substantially the same in a spin-valve in accordance with this invention as in a conventional SAL (Soft-Adjacent Layer) head. The longitudinal bias field is applied through abutted junctions, using either a pair of permanent magnets or a pair of exchange layers.

When the spin-valve sensor in accordance with this invention is not in use, both the fixed-layer and the free-layer are biased longitudinally, in the same direction as dictated by the magnetic source located at the electrical leads. When the sensor is actively reading the prerecorded magnetic pattern, a sufficiently large sensing current is applied longitudinally through the sensor area. This current causes a strong transverse bias field which saturates the fixed-layer. It overrides the horizontal bias field in the fixed-layer, except near the electrical leads. Thus the magnetic field in the fixed-layer is unaffected by the readback field. Advantageously, the fixed-layer at this saturated state is functionally equivalent to a pinned-layer, except that the direction of saturating field is always transverse to the sensing area, unaffected by the history of magnetization of the sensing area. The sensor is thus insensitive to electrical overstress and flash temperature. It is less sensitive to ESD damage than a conventional spin-valve sensor. It can also operate at a lower spacing from the recorded medium, hence achieving a higher storage density than a conventional spin-valve.

When the spin-valve sensor in accordance with this invention is actively reading, the free-layer is not biased exactly longitudinally. A transverse field generated by the sensing current causes the resultant magnetic bias field to deviate from the longitudinal axis. The angle from the longitudinal axis to the resultant magnetic field is called the bias angle. Similar to the bias angle of the MR-layer in a conventional SAL (Soft-Adjacent Layer) head, the bias angle increases initially from zero with increasing sensing current, then stops (plateaus) at a constant value which is determined by the moment ratio. By making the moment ratio approximately 0.5, the bias angle is approximately 30°.

The non-zero bias-angle does have mild disadvantages as follows:

1. Sensitivity of the sensor decreases slightly, by about 7%.
2. The linearity of the sensor degrades slightly, causing approximately 2% asymmetry in the readback signal.
3. The monotonic operating range of the sensor is reduced by approximately 50%.

However each of the above disadvantages is insignificant in a state-of-art magnetic recording device. The sensitivity of a spin-valve sensor is at least twice that of an AMR (Amorphous MagnetoResistive) sensor. Thus a 7% loss in sensitivity is tolerable. Adapted for AMR (Amorphous MagnetoResistive) heads, which have greater than 2% asymmetry, the electronic portion of a magnetic recording system can handle 2% asymmetry without difficulty. Finally the operating range of the spin-valve sensor in accordance with this invention is still about ten times the readback field. There is nothing to gain by extending the range to twenty times the readback field.

Even in a conventional spin-valve sensor, the bias angle of the free-layer is not exactly zero. This is because the pinned-layer and the sensing current both apply a transverse magnetic moment on the free-layer. Traditionally, the direction of sensing current is selected such that these two transverse moments offset each other. This practice has two disadvantages as follows:

1. The transverse moment generated by the sensing current tends to demagnetize the pinned-layer. When the pinned-layer undergoes a temperature elevation, e.g. due to electrical overstress or slider-disk interference, it can be demagnetized or even re-magnetized in a different direction. This causes instability of the sensor.
2. The transverse moments will not cancel each other exactly, except at one particular level of sensing current, which differs from sensor to sensor. Thus the ideal of zero bias-angle is not achieved anyway.

Therefore the mild loss in readback sensitivity and symmetry is more than justified by the significant improvement in the stability of sensor.

Two preferred embodiments of this invention are described below. In each case the sensor structure, while similar to that of a conventional SAL (Soft-Adjacent Layer) head has a fundamental structural difference which provides the substantial advantages which are described above.

FIG. 1 shows a planar view of a spin-valve sensor 10 with a sensing area (SA) 12, but without top and bottom shields which have been omitted for convenience of illustration. In FIG. 1 a left lead 14 is connected to the left end LE of a sensing area (SA) 12. A right lead 16 is connected to the right end RE of sensing area (SA) 12.

Figure 2:
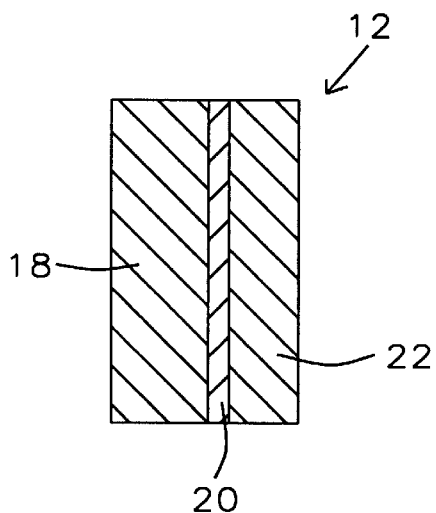
FIG. 2 shows a cross-sectional view of the sensing area taken (through the axis of symmetry of the spin-valve sensor) along line 2—2 in FIG. 1 including fixed layer, and a spacer layer which comprises a good conductor and a free layer.

FIG. 2 shows a cross-sectional view of sensing area (SA) 12 taken (through the axis of symmetry of the spin-valve sensor) along line 2—2 in FIG. 1 including fixed layer 18, spacer layer 20 comprising a good conductor, e.g. copper, and a free-layer 22. Rotation of the magnetic field in the free-layer 22 alters the angle between two fields separated by the spacer-layer 20, hence causing a resistance change in the sensing area (SA) 12.

Figure 3A:
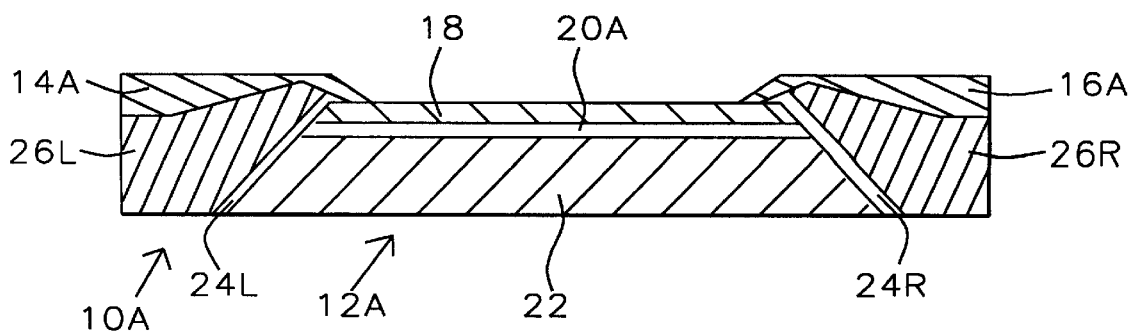
FIG. 3A shows a cross-sectional end view of an embodiment of a spin valve sensor in accordance with this invention taken through the electrical lead of FIG. 1 taken along line 3A—3A in FIG. 1 with permanent magnets between the sensor and the leads.
Figure 4A:
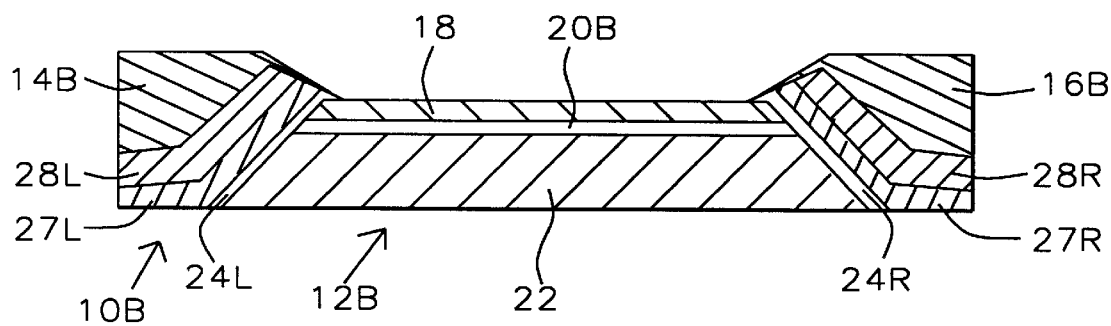
FIG. 4A shows a cross-sectional end view of an embodiment of a spin valve sensor in accordance with this invention taken through the electrical lead of FIG. 1 taken along line 3A—3A in FIG. 1 with exchange bias magnetization layers between the sensor and the leads.

FIGS. 3A and 4A show two cross-sectional end views taken along line 3A—3A in FIG. 1, which illustrate embodiments of the spin valve sensors 10A and 10B of the spin valve sensor 10 of FIG. 1 in accordance with this invention. The views of FIGS. 3A and 4A show sections taken through the electrical lead of FIG. 1.

In both preferred embodiments, shown in FIGS. 3A and 4A, the left leads 14A/14B and right leads 16A/16B are connected to a sensing area 12A/12B through abutted junctions, as is done with a conventional SAL (Soft-Adjacent Layer) head as will be well understood by those skilled in the art.

Figure 3B:
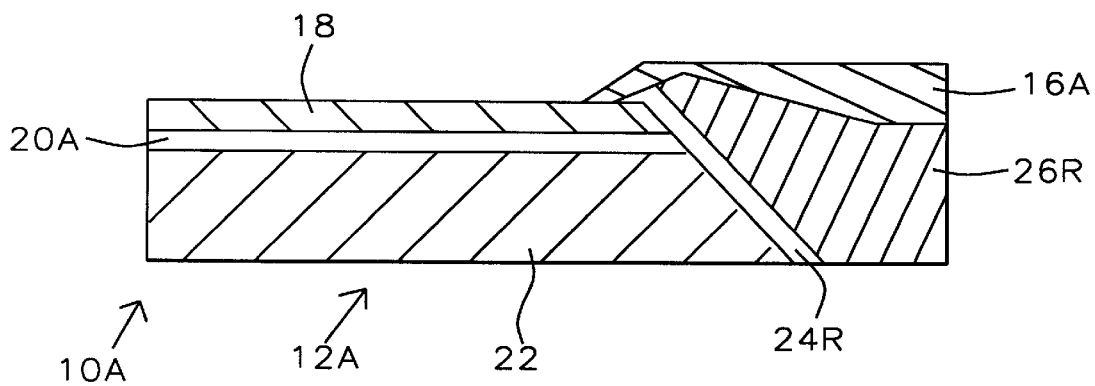
FIG. 3B is an enlarged fragment of the sensor of FIG. 3A.

FIG. 3A shows a cross-sectional end-view of a spin-valve sensor 10A in accordance with this invention with permanent magnets 26L/26R for longitudinal bias. FIG. 3B is an enlarged fragment of the device of FIG. 3A showing the right half of sensor 10A.

In the embodiment of FIGS. 3A and 3B, spin-valve sensor 10A includes a sensing area 12A which is shown with the fixed layer 18, copper spacer layer 20A and the free-layer 22 extending between left electrical lead 14A and right electrical lead 16A. Sensing area 12A comprises the three laminated layers including fixed layer 18, spacer layer 20A and free-layer 22 which extend between the two ends of sensing area 12A. In other words, the electrical leads 14A and 16A are formed at the ends of the laminated sensing area 12A. In this case, longitudinal moment is supplied in the sensing area 12A between the electrical lead 14A and electrical lead 16A which have abutted junctions respectively to a pair of permanent magnets including left magnet 26L and right magnet 26R. The left magnet 26L and right magnet 26R are in direct contact with opposite ends of the sensing area 12A, but the sensing area 12A is optionally separated from each of the magnets 26L and 26R by optional underlayers 24L/24R for magnets 26L/26R. The left lead 14A is shown located directly upon the top surface of the left magnet 14A, with one end of the left lead 26L extending into direct contact with the left end of the top surface of the fixed layer 18. The right lead 16A is shown located directly upon the top surface of the right magnet 26R, with one end of the left lead 14A extending into direct contact with the right end of the top surface of the fixed layer 18.

Figure 4B:
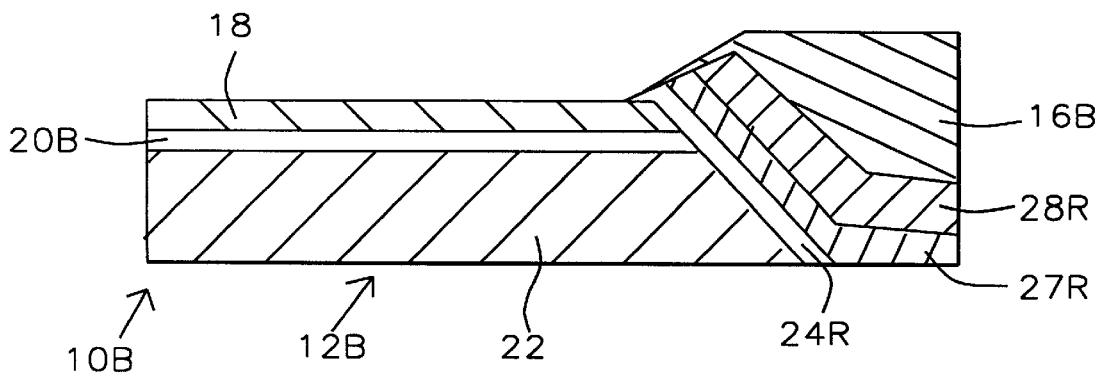
FIG. 4B is an enlarged fragment of the sensor of FIG. 4A.

FIGS. 4A and 4B show cross-sectional end-views of a spin-valve sensor of an alternative to the embodiment of FIGS. 3A and 3B, in which permanent magnets 26L and 26R are replaced by two pairs of exchange-coupled thin films 27L/28L and 27R/28R for longitudinal bias, as shown in FIG. 4A. FIG. 4A shows an end-view of a spin-valve sensor 10B in accordance with this invention with exchange bias layers 27L/28L and 27L/26R included to provide longitudinal bias. FIG. 4B is an enlarged fragment of the device of FIG. 4A showing the right half of sensor 10B.

In the embodiment of FIGS. 4A and 4B, spin-valve sensor 10B includes a sensing area 12B which is shown with the fixed layer 18, spacer layer 20B and the free-layer 22. The sensing area 12B is located between leads 14B and 16B. FIG. 4B is an enlarged fragment of the device of FIG. 4A showing the right half of device 10B. In FIG. 4B, the fixed layer 18, the spacer layer 20B and the free-layer 22 are shown on the left.

In the case of the device 10B of FIGS. 4A and 4B, the longitudinal moment is supplied by a pair of exchange-coupled films located between the sensor 10B and the leads 14B and 16B. This is shown by the exchange-coupled films 27L/28L on the left and the matching exchange-coupled films 27R/28R on the right including ferromagnetic layer 26, e.g. NiFe, and an AntiFerroMagnetic (AFM) layer 28, e.g. NiO or FeMn. Optionally ferromagnetic NiFe layers 27L and 27R are separated from the sensing area 12B by a pair of underlayers, i.e. underlayer 24L for layer 27L and underlayer 24R for layer 27R.

A fundamental difference between the spin-valves embodiments in accordance with this invention and a conventional SAL (Soft-Adjacent Layer) is that the a poor conductor of the SAL (Soft-Adjacent Layer) is replaced with a good conductor to a layer of a good conductor, e.g. copper for spacer-layers 20A and 20B forming a very thin conductor (about 30 Å thick). Another difference between a conventional SAL (Soft-Adjacent Layer) and the spin-valve of this invention is that both the fixed-layer 18 and the free-layer 22 are substantially thinner than the corresponding soft-layer and MR-layer of a conventional SAL (Soft-Adjacent Layer).

In the cases of both FIG. 3A and FIG. 4A, the fixed-layer 18 is biased transversely by the sensing current, except at the locations near to the lead 16A and lead 16B where longitudinal bias moment is dominant. The region which is dominated by the longitudinal bias is very narrow, because the fixed-layer 18 is very thin, and the transverse field generated by the sensing current is very strong. On the other hand, the free-layer 22 is not biased perfectly longitudinally. This transverse field generated by the sensing current and the demagnetization field from the fixed-layer do not cancel, as stated in Gill U.S. Pat. No. 5,666,248. In fact the combination of the readback field and the transverse field generated by the sensing current can not overcome the demagnetization field from the fixed-layer 18. Therefore the resultant field in the free-layer 22 will never flip over the longitudinal axis during normal reading. This is correctly predicted by Gill U.S. Pat. No. 5,666,248. In the absence of a longitudinal bias field, a sensor in accordance with the present invention would indeed be non-functional, because the angle between magnetization of fixed-layer 18 and the magnetization of free-layer 22 would remain constant.

However in the presence of a longitudinal bias field, the resultant magnetization of the free-layer 22 can rotate freely under the influence of the readback field. Because the spin-valve effect manifests itself, the sensor of this invention operates very well as a giant magnetoresistive (GMR) sensor.

Nonetheless the performance of the spin-valve sensor, including sensitivity and linearity, improves as the free-layer bias field approaches the longitudinal axis. To reduce the free-layer bias angle, optional measures can be implemented as follows:

1. The fixed-layer 18 can be constructed with material with high uniaxial anisotropy. This can be done by choosing materials of appropriate magnetostriction or intrinsic uniaxial anisotropy.

A fixed-layer 18 with appropriate magnetostriction can be composed of NiFe, NiFeCo, NiFe/CoFe, NiFe/Co, Co, and CoFe. The appropriate/proper magnetostriction is typically of very large positive value, for example greater than $10^{-6}$.

It is usually achieved by adjusting the material composition of the fixed-layer 18.

A fixed-layer 18 with appropriate intrinsic uniaxial anisotropy can also be composed of NiFe, NiFeCo, NiFe/CoFe, NiFe/Co, Co, and CoFe.

Figure 5:
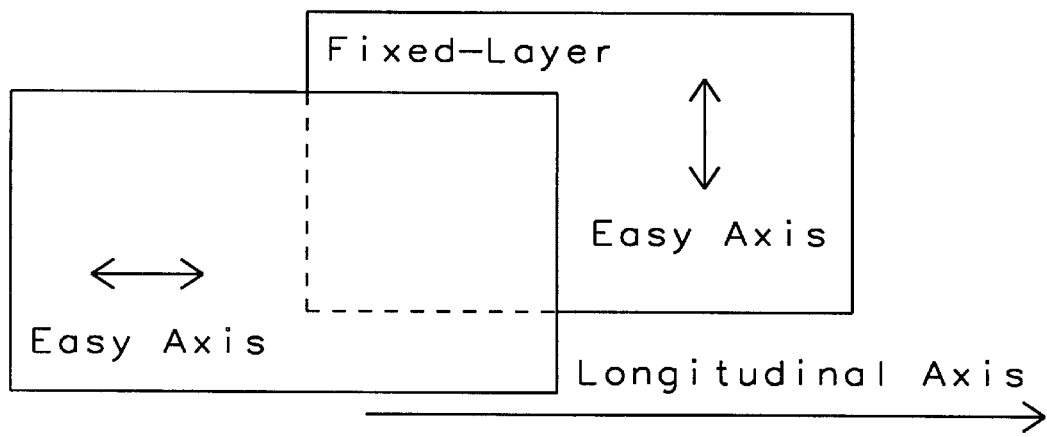
FIG. 5 which shows a schematic diagram of the preferred easy axes orientation with respect to the longitudinal axis.

The free-layer 22 is without high uniaxial anisotropy. Nonetheless, the easy axis in each layer is oriented along the desired magnetization direction as shown in FIG. 5 which shows a schematic diagram of the preferred easy axes orientation with respect to the longitudinal axis. The free-layer 22 can be composed of NiFe, NiFeCo, NiFe/CoFe, and NiFe/Co.

2. The longitudinal bias field can be canted in the direction of desired transverse field in the fixed-layer. This can be achieved by using a contiguous junction, where the lead structure consists of a combination of a ferromagnetic layer and an anti-ferromagnetic layer coupled through exchange as shown in FIG. 6A.

Figure 6A:
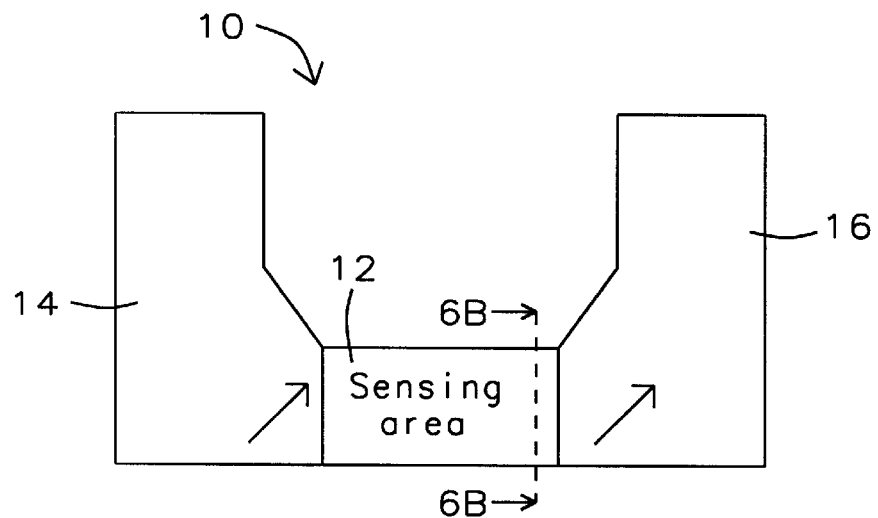
FIG. 6A is a schematic diagram with a planar view similar to FIG. 1 showing the sensor with leads showing the canting direction angle in the leads consistent with the desired fixed-layer magnetization.

FIG. 6A is a schematic diagram with a planar view similar to FIG. 1 showing the spin-valve sensor 10 with the sensing area (SA) 12 and with leads 14 and 16 showing the canting direction angle in leads 14 and 16 consistent with the desired fixed-layer magnetization.

Figure 6B:
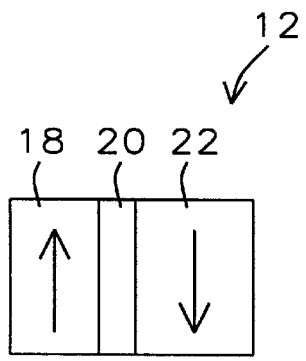
FIG. 6B is a cross-sectional of the sensor of FIG. 6A taken along line 6B—6B, with the magnetic field pointing upwardly in the fixed layer and down in the free layer, with the spacer layer in the middle.

FIG. 6B is a cross-sectional view of the sensing area (SA) 12 of FIG. 6A taken along line 6B—6B, with the magnetic field pointing upwardly in the fixed layer 18 and down in the free layer 22, with the spacer layer 20 in the middle.

Ramifications

Figure 8A:
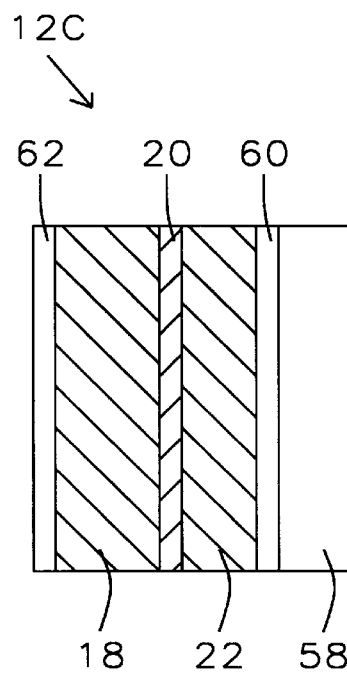
FIGS. 8A and 8B show a sensing area which comprises a free-layer, a spacer and a fixed-layer as shown in FIG. 2, which further includes a seed-layer and a cap-layer for improving their crystalline structure, hence improving their magnetic properties.
Figure 8B:
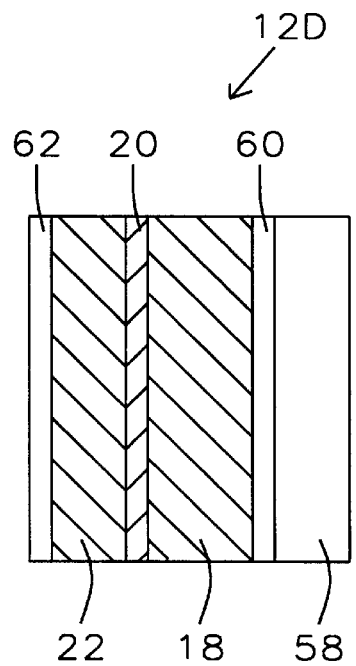

Referring to FIGS. 8A and 8B, the sensing area 12, which comprises a free-layer 22, a spacer 20 and a fixed-layer 18 shown in FIG. 2, may further include a seed-layer 60 and/or a cap-layer 62 for improving their crystalline structure, hence improving their magnetic properties. The positions of the fixed-layer 18 and the free-layer 22 can be transposed. Also the underlayers (24L/24R FIGS. 3A, 3B, 4A, 4B) for longitudinal bias are optional.

In FIGS. 8A and 8B, alternative sensing areas 12C/12D are formed on a substrate 58 (such as a wafer). In each case, on the surface of substrate 58, a seed layer 60 is formed.

In FIG. 8A, the free-layer 22 is formed on the surface of the seed layer 60 of sensing area 12C. Then the spacer 20 and a fixed-layer 18 are formed and cap layer 62 is formed on the surface of the fixed-layer 18.

Alternatively, in FIG. 8B, the fixed-layer 18 is formed on the surface of the seed layer 60 of sensing area 12D. Then the spacer 20 and a free-layer 22 are formed and cap layer 62 is formed on the surface of the free-layer 22.

The seed-layer 60 and cap-layer 62 are usually of different compositions and thicknesses. However, they are typically in the order of from about 30 Å to about 60 Å in thickness, and composed of Ta, Cr, NiFeCr, NiCr or CoZrNb.

The constructions of seed-layer 60 and cap-layer 62 are similar to the construction of layers 18, 20 and 22 (the fixed-layer 18, spacer 20, and free-layer 22). Typically, it begins with a vacuum sputter-etching process for removing contamination and oxide from the wafer-surface. This improves adhesion. The layer to be constructed is then deposited by a vacuum sputtering process. This process is well known to those skilled in the art.

Problems Solved and Advantages

1. The novel spin-valve disclosed herein is analogous to a conventional SAL (Soft-Adjacent Layer) AMR (Amorphous MagnetoResistive) head. Thus it can be produced simply with existing technology.

2. The absence of a permanent pinning layer in accordance with this invention eliminates problems associated with finding suitable material, and the consequence of being forced to use unsuitable material. Specifically, problems of corrosion and low block temperature are eliminated automatically.

3. The absence of a permanent pinning layer eliminates the problem of inadvertently disturbing the pinning field. The sensor of this invention is much more tolerant to ESD/EOS (electrical over-stress) damage than a conventional spin-valve sensor. Thus the yield is improved, and the cost of assembly-line ESD prevention is dramatically reduced.

4. The sensor of this invention is more tolerant to thermal disturbance than the conventional spin-valve sensor. This is because the only permanent (longitudinal) bias source is located on the electrical leads, which are much cooler than the sensing area. Thus the sensor in accordance with this invention can be operated at a higher level of sensing current, thereby increasing the output signal. For the same reason, the sensor in accordance with this invention can tolerate more frequent and more severe slider-disk interference. Thus the sensor of this invention can provide higher density of information storage.

5. The absence of a permanent pinning layer on the sensing area makes the magnetic bias insensitive to the history of magnetization. In other words the head in accordance with this invention has no memory of thermal, electrical, or magnetic disturbance, which can have momentarily caused undesirable state of magnetization. Therefore the sensor in accordance with this invention can be operated more reliably than a conventional spin-valve sensor.

6. The absence of a permanent pinning layer significantly reduces the thickness of the sensing area. This enables the shield-to-shield spacing be reduced accordingly, whereby improving the pulse-width, which in turn leads to the improvement in storage density.

Figure 7:
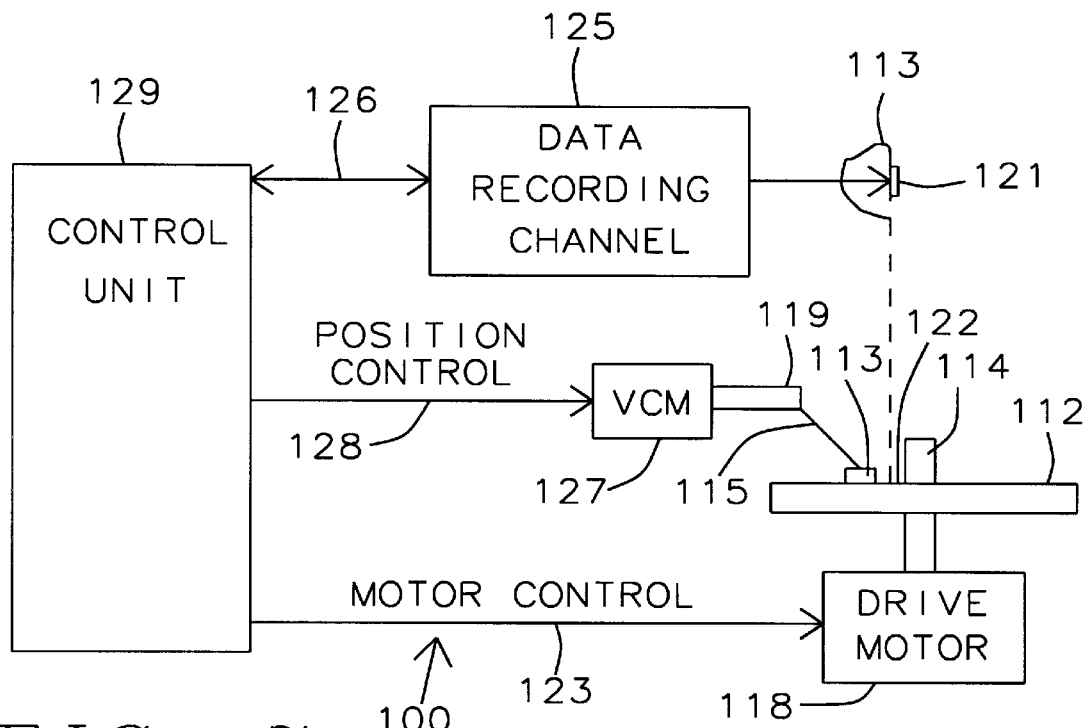
FIG. 7 shows an embodiment of this invention employing the sensors of FIGS. 1, 3 and 4 on a head embodied in a magnetic disk storage system.

FIG. 7 shows an embodiment of this invention employing the sensor 10, 10A or 10B of FIGS. 1, 3 and 4 on head 121 embodied in a magnetic disk storage system. In FIG. 7, at least one rotatable magnetic disk 112 is supported on a spindle 114 and rotated by a disk drive motor 118. The magnetic recording media on each disk comprises conventional data storage tracks (not shown) on disk 112.

A slider 113, which is positioned just above the disk 112, supports a magnetic read/write head 121. As the disk rotates, the slider 113 moves radially in and out over disk surface 122 so that head 121 may access different tracks on disk 112 where recorded data is to be accessed or to be recorded. A suspension 115 secures the slider 113 to an actuator arm 119. Suspension 115 provides a slight spring force which biases slider 113 towards the disk surface 122. Actuator arm 119 is attached to an actuator 127, which may be a Voice Coil Motor (VCM) comprising a coil movable within a fixed magnetic field. The direction and speed of the coil movements are controlled by the electrical current from control unit 129.

As disk 112 rotates, positive air pressure is generated which provides an air bearing which lifts slider 113 above the disk surface 122 by exerting an upward air pressure force or lift on the slider 113 which is balanced by the spring force of suspension 115. Thus the air bearing supports slider 113 above the disk surface 122 by a small, substantially constant spacing during normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to move and position slider 113 optimally to the desired data track on disk 112. Read and write signals are communicated to and from read/write heads 121 by means of recording channel 125. Control unit 129 is connected to the data recording channel 125 by line 126.

The above description of a magnetic disk storage system, and the accompanying illustration of FIG. 7 are provided to elucidate the mode of use of the sensors 10, 10A or 10B of FIGS. 1, 3 and 4 on a magnetic recording head 121 in FIG. 7, in accordance with this invention. It should be apparent that disk storage systems may contain a large number of disks and actuators, and each actuator may support a number of sliders.

It will be well understood by those skilled in the art that the invention is also applicable to other magnetic recording systems such as a magnetic tape recording systems.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A spin-valve sensor in accordance with this invention comprises:

a laminated sensor including three layers which comprise two magnetic layers separated by a thin spacer layer, with said three layers extending in parallel between opposite ends of said sensor, electrical leads connected to said opposite ends of said sensor, said sensor being longitudinally biased, by a pair of permanently magnetized structures located at said opposite ends of said sensor.

2. The sensor of claim 1 wherein said permanently magnetized structures are permanent magnets.

3. The sensor of claim 1 wherein said permanently magnetized structures are exchange-coupled thin films.

4. The sensor of claim 3 wherein said exchange-coupled films are canted in a direction consistent with a desired direction of fixed-layer magnetization.

5. The sensor of claim 1 wherein each layer of said sensor has an easy axis and said easy axis of each layer of said sensor is aligned with a respective desired direction of magnetization.

6. The sensor of claim 1 wherein said permanently magnetized structure incorporates a seed-layer and a capping layer for improving the magnetic property.

7. A spin-valve sensor in accordance with this invention comprises:

a laminated sensor including three layers which comprise a fixed magnetic layer and a free-layer separated by a thin spacer layer with said three layers extending in parallel between opposite ends of said sensor, electrical leads interconnected to said opposite ends of said sensor, and said sensor being longitudinally biased by permanently magnetized structures located between said electrical leads and said ends of said sensor, and each of said electrical leads being interconnected to one of said ends of said sensor through one of said permanently magnetized structures.

8. The sensor of claim 7 wherein said permanently magnetized structures are permanent magnets.

9. The sensor of claim 7 wherein said permanently magnetized structures are exchange-coupled thin films.

10. The sensor of claim 9 wherein said exchange-coupled films are canted in a direction consistent with a desired direction of fixed-layer magnetization.

11. The sensor of claim 7 wherein each layer of said sensor has an easy axis and said easy axis of each layer of said sensor is aligned with a respective desired direction of magnetization.

12. The sensor of claim 7 wherein said transverse bias of said fixed-layer is enhanced by a transverse high uniaxial anisotropy, with a selected material with proper magnetostriction.

13. The sensor of claim 7 wherein said permanently magnetized structure incorporates a seed-layer and a capping layer for improving the magnetic property.

14. A method of forming a spin-valve sensor comprising:

forming a laminated sensor including three layers which comprise a fixed magnetic layer and a free-layer separated by a thin spacer layer, said three layers extending in parallel between opposite ends of said sensor, forming electrical leads connected to the opposite ends of said sensor, and forming permanently magnetized structures located between said electrical leads and said opposite ends of said sensor for biasing said sensor longitudinally.

15. A method in accordance with claim 14 wherein said permanently magnetized structures are permanent magnets.

16. A method in accordance with claim 14 wherein said permanently magnetized structures are exchange-coupled thin films.

17. A method in accordance with claim 16 wherein said exchange-coupled films are canted in a direction consistent with a desired direction of fixed-layer magnetization.

18. A method in accordance with claim 16 wherein each layer of said sensor has an easy axis and said easy axis of each layer of said sensor is aligned with a respective desired direction of magnetization.

19. A method in accordance with claim 16 wherein said transverse bias of said fixed-layer is enhanced by a transverse high uniaxial anisotropy, with a selected material with proper magnetostriction.

20. A method in accordance with claim 16 wherein said permanently magnetized structure incorporates a seed-layer and a capping layer for improving the magnetic property.

21. The method of claim 14 wherein the fixed layer with appropriate magnetostriction is composed of a material selected from the group consisting of NiFe, NiFeCo, NiFe/CoFe, NiFe/Co, Co, and CoFe.

22. The method of claim 14 wherein the fixed layer with appropriate intrinsic uniaxial anisotropy is composed of a material selected from the group consisting of NiFe, NiFeCo, NiFe/CoFe, NiFe/Co, Co, and CoFe.

23. The method of claim 14 wherein the free layer composed of a material selected from the group consisting of NiFe, NiFeCo, NiFe/CoFe, and NiFe/Co.

24. The method of claim 14 wherein:

the fixed layer with appropriate magnetostriction is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

25. The method of claim 14 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

26. The method of claim 14 wherein the fixed layer with appropriate magnetostriction is composed of a material selected from the group consisting of NiFe, NiFeCo, NiFe/CoFe, NiFe/Co, Co, and CoFe, and the spacer layer is composed of a material selected from the group consisting of copper.

27. The method of claim 14 wherein the fixed layer with appropriate intrinsic uniaxial anisotropy is composed of a material selected from the group consisting of NiFe, NiFeCo, NiFe/CoFe, NiFe/Co, Co, and CoFe, and the spacer layer is composed of a material selected from the group consisting of copper.

28. The method of claim 14 wherein the free layer composed of a material selected from the group consisting of NiFe, NiFeCo, NiFe/CoFe, and NiFe/Co, and the spacer layer is composed of a material selected from the group consisting of copper.

29. The method of claim 14 wherein:

the fixed layer with appropriate magnetostriction is composed of a material selected from the group consisting of NiFe, NiFeCo, NiFe/CoFe, NiFe/Co, Co, and CoFe, the free layer is composed of a material selected from the group consisting of NiFe, NiFeCo, NiFe/CoFe, NiFe/Co, and the spacer layer is composed of a material selected from the group consisting of copper.

30. The method of claim 14 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, NiFe/Co, and the spacer layer is composed of a material selected from the group consisting of copper.

31. A spin-valve sensor comprising:

a laminated sensor including three layers which comprise a fixed magnetic layer and a free-layer separated by a thin spacer layer, said three layers extending in parallel between opposite ends of said sensor, electrical leads connected to said opposite ends of said sensor, said sensor being longitudinally biased, by a pair of permanently magnetized structures located at said opposite ends of said sensor.

32. The sensor of claim 31 wherein the fixed layer with appropriate magnetostriction is composed of a material selected from the group consisting of NiFe, NiFeCo, NiFe/CoFe, NiFe/Co, Co, and CoFe.

33. The sensor of claim 31 wherein the fixed layer with appropriate intrinsic uniaxial anisotropy is composed of a material selected from the group consisting of NiFe, NiFeCo, NiFe/CoFe, NiFe/Co, Co, and CoFe.

34. The sensor of claim 31 wherein the free layer composed of a material selected from the group consisting of NiFe, NiFeCo, NiFe/CoFe, and NiFe/Co.

35. The sensor of claim 31 wherein:

the fixed layer with appropriate magnetostriction is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

36. The sensor of claim 31 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

37. The sensor of claim 31 wherein the fixed layer with appropriate magnetostriction is composed of a material selected from the group consisting of NiFe, NiFeCo, NiFe/CoFe, NiFe/Co, Co, and CoFe, and the spacer layer is composed of a material selected from the group consisting of copper.

38. The sensor of claim 31 wherein the fixed layer with appropriate intrinsic uniaxial anisotropy is composed of a material selected from the group consisting of NiFe, NiFeCo, NiFe/CoFe, NiFe/Co, Co, and CoFe, and the spacer layer is composed of a material selected from the group consisting of copper.

39. The sensor of claim 31 wherein the free layer composed of a material selected from the group consisting of NiFe, NiFeCo, NiFe/CoFe, and NiFe/Co, and the spacer layer is composed of a material selected from the group consisting of copper.

40. The sensor of claim 31 wherein:

the fixed layer with appropriate magnetostriction is composed of a material selected from the group consisting of NiFe, NiFeCo, NiFe/CoFe, NiFe/Co, Co, and CoFe, the free layer is composed of a material selected from the group consisting of NiFe, NiFeCo, NiFe/CoFe, NiFe/Co, and the spacer layer is composed of a material selected from the group consisting of copper.

41. The sensor of claim 31 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, NiFe/Co, and the spacer layer is composed of a material selected from the group consisting of copper.

42. A method of forming a spin-valve sensor comprising:

forming a laminated sensor including three layers which comprise a fixed magnetic layer and a free-layer separated by a thin spacer layer, said three layers extending in parallel between opposite ends of said sensor, forming electrical leads connected to said opposite ends of said sensor, said sensor being longitudinally biased, by a pair of permanently magnetized structures located at said opposite ends of said sensor.

43. The method of claim 42 wherein the fixed layer with appropriate magnetostriction is composed of a material selected from the group consisting of NiFe, NiFeCo, NiFe/CoFe, NiFe/Co, Co, and CoFe.

44. The method of claim 42 wherein the fixed layer with appropriate intrinsic uniaxial anisotropy is composed of a material selected from the group consisting of NiFe, NiFeCo, NiFe/CoFe, NiFe/Co, Co, and CoFe.

45. The method of claim 42 wherein the free layer composed of a material selected from the group consisting of NiFe, NiFeCo, NiFe/CoFe, and NiFe/Co.

46. The method of claim 42 wherein:

the fixed layer with appropriate magnetostriction is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

47. The method of claim 42 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co.

48. The method of claim 42 wherein the fixed layer with appropriate magnetostriction is composed of a material selected from the group consisting of NiFe, NiFeCo, NiFe/CoFe, NiFe/Co, Co, and CoFe, and the spacer layer is composed of a material selected from the group consisting of copper.

49. The method of claim 42 wherein the fixed layer with appropriate intrinsic uniaxial anisotropy is composed of a material selected from the group consisting of NiFe, NiFeCo, NiFe/CoFe, NiFe/Co, Co, and CoFe, and the spacer layer is composed of a material selected from the group consisting of copper.

50. The method of claim 42 wherein the free layer composed of a material selected from the group consisting of NiFe, NiFeCo, NiFe/CoFe, and NiFe/Co, and the spacer layer is composed of a material selected from the group consisting of copper.

51. The method of claim 42 wherein:

the fixed layer with appropriate magnetostriction is composed of a material selected from the group consisting of NiFe, NiFeCo, NiFe/CoFe, NiFe/Co, Co, and CoFe, the free layer is composed of a material selected from the group consisting of NiFe, NiFeCo, NiFe/CoFe, NiFe/Co, and the spacer layer is composed of a material selected from the group consisting of copper.

52. The method of claim 42 wherein:

the fixed layer with appropriate intrinsic uniaxial anisotropy is composed of a material selected from the group consisting of NiFe, NiFeCo, NiFe/CoFe, NiFe/Co, Co, and CoFe, and the free layer is composed of a material selected from the group consisting of NiFe, NiFeCo, NiFe/CoFe, and NiFe/Co, and the spacer layer is composed of a material selected from the group consisting of copper.

* * * * *